United States Patent [19]

Tung

[11] 4,155,014

[45] May 15, 1979

[54] LOGIC ELEMENT HAVING LOW POWER CONSUMPTION

[75] Inventor: Pham N. Tung, Paris, France

[73] Assignee: Thomson-CSF, Paris, France

[21] Appl. No.: 862,437

[22] Filed: Dec. 16, 1977

[30] Foreign Application Priority Data

Dec. 21, 1976 [FR] France .............................. 76 38484

[51] Int. Cl.² ...................... H03K 19/08; H03K 19/36
[52] U.S. Cl. ................................... 307/213; 307/215;
307/299 A; 357/92
[58] Field of Search ........... 307/213, 214, 215, 299 A;
357/92

[56] References Cited

U.S. PATENT DOCUMENTS

| | | | |
|---|---|---|---|
| 3,402,330 | 9/1968 | Archer | 307/213 X |
| 3,515,899 | 6/1970 | May | 307/213 X |
| 3,617,778 | 11/1971 | Korom | 307/213 X |
| 3,655,999 | 4/1972 | Wiedmann | 307/299 A X |
| 3,916,218 | 10/1975 | Berger et al. | 307/213 |
| 4,032,796 | 6/1977 | Fulkerson | 307/213 X |
| 4,035,664 | 7/1977 | Berger et al. | 307/213 X |
| 4,065,187 | 12/1977 | Suzuki et al. | 307/213 X |
| 4,065,680 | 12/1977 | Russell | 307/213 X |

FOREIGN PATENT DOCUMENTS 2634304  2/1977  Fed. Rep. of Germany ............. 357/92

OTHER PUBLICATIONS

Robbins, "MTL Exclusive OR Circuit", *IBM Tech. Discl. Bull.,* vol. 19, No. 6, p. 2077, 11/1976.
Berger et al., "TTL Circuit with Improved Noise Margins", *IBM Tech. Discl. Bull.,* vol. 19, No. 1, pp. 142–143, 6/1976.
Chin et al., "MTL-Compatible Current Switch Circuit", *IBM Tech. Discl. Bull.,* vol. 19, No. 6, pp. 2081–2083, 11/1976.
*Electronics* (pub.), pp. 91–95, 2/21/74.

*Primary Examiner*—Larry N. Anagnos
*Attorney, Agent, or Firm*—Cushman, Darby & Cushman

[57] ABSTRACT

A logic element having low power consumption comprises first lateral PNP transistor whose base and emitter are respectively connected to fixed bias sources, the base voltage being smaller than the emitter voltage, and the collector of said transistor being integral with the base of a transverse NPN transistor integrated into the same substrate, the assembly forming a set of four layers defining three semiconductor junctions. The NPN transistor comprises several emitters, one of which is connected to the base of another NPN transistor whose collector is connected to the output of the device and whose emitter is earthed.

5 Claims, 7 Drawing Figures

LOGIC ELEMENT HAVING LOW POWER CONSUMPTION

The present invention relates to a logic element with a low power consumption.

Those skilled in the art will be aware that certain logic elements can be manufactured using complementary transistors formed from four layers forming three rectifying junctions. The majority of these comprises a lateral transistor, that is to say a transistor in which the current flows parallel to the substrate surface, and a transverse transistor, that is to say one in which the current flows perpendicularly to the said surface.

These logic elements have a serious drawback; the gain of the lateral transistor is always low and to overcome this problem, it is necessary to have recourse to certain expedients,. namely the use for example of embedded N+-type layers, the lateral transistor generally being of PNP type, in order to limit the vertical current which is one of the major causes of the low gain in these transistors.

The object of the present invention is a novel logic element of this kind in which this drawback is partially avoided.

The logic element in accordance with the invention comprises a pair of complementary transistors integrated into the same substrate, one being of lateral type and the other of transverse type, the assembly being formed by four layers forming three rectifying junctions.

The element is essentially characterised in that the base and emitter of the lateral transistor are respectively connected to fixed bias sources and in that the transverse transistor comprises several emitters, the bias sources being chosen in such a manner that each base-emitter junction of the second transistor is unblocked when a corresponding emitter is earthed.

The invention will be better understood from a consideration of the ensuing description and reference to the attached drawings in which.

Figure 1:
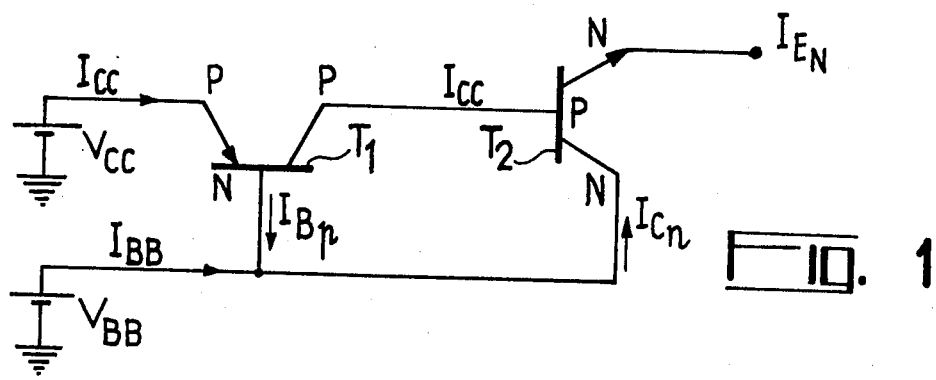
FIG. 1 illustrates the diagram of a known device, enabling the invention to be understood.
Figure 2:
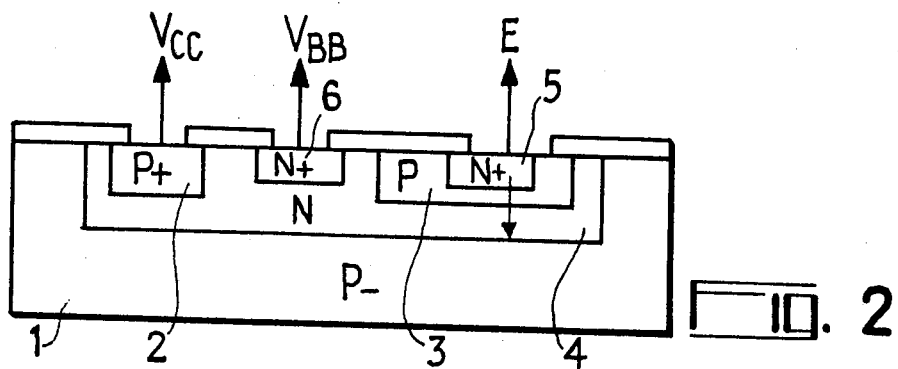
FIG. 2 illustrates a cross-sectional view the device shown in FIG. 1.

FIGS. 1 and 2 illustrate an assembly of two complementary transistors T1 and T2 of PNP (T1) and NPN (T2) type respectively, interconnected in the indicated manner, the base N of the transistor T1 being connected to the collector of transistor T2, whilst the collector P of the transistor T1 is connected to the base of the transistor T2. The assembly is integrated into a P-type substrate 1. The emitter of the transistor T1 is a P+ zone diffused at the same time as a layer 3 of the same type and same doping concentration.

These two diffusion zones are fomed in an N-type zone 4, part of which acting as the base of the transistor T1 and another part as the collector of the transistor T2.

Finally, in the zone 3 there is implanted or diffused an N+ conductivity type; type zone 5 acting as emitter for the transistor T2 and a zone 6 of the same type acting as contact for the zone 4. The overall arrangement acts as a current source.

The voltages $V_{BB}$ and $V_{CC}$ are chosen so that $V_{BB}$ is substantially lower than $V_{CC}$, namely $V_{BB}=1V$ and $V_{CC}=2V$, for example.

The result is that, when the base-emitter junction of the transistor T2 is conducting, there is a substantially constant potential difference between the two terminals of the emitter-base junction, of the order of 1V. The second transistor then operates as an emitter-follower. This case occurs when the emitter of the transistor T2 is at a lower voltage than 1V and for example earthed.

For a higher voltage applied to the emitter, the junction is blocked so that current ceases to flow to the emitter.

This property is used in the circuit in accordance with the invention as shown in the following Figures.

Figure 3:
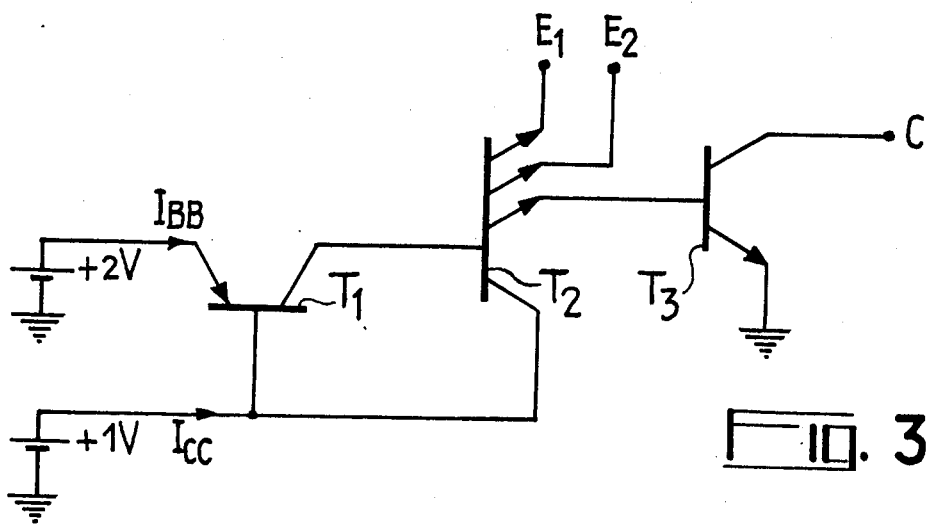
FIG. 3 is the block diagram of the elements in accordance with the invention and FIG. 4 is a cross-section through the same, whilst
Figure 4:
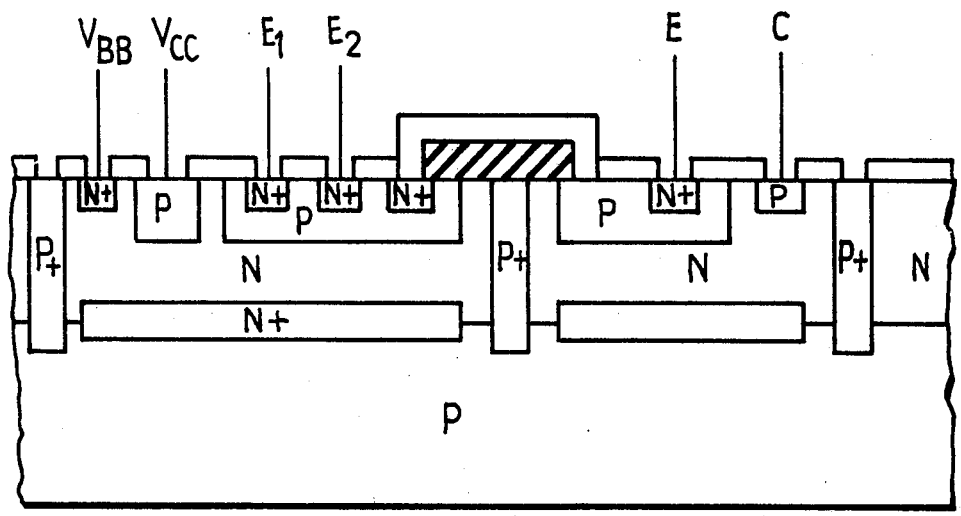

FIGS. 3 and 4 illustrate a circuit in which the transistor T2 has three N-type emitters. Two of these, E1 and E2 can be placed at a voltage which is capable of acquiring two levels: one of these corresponds to the "1" state and is greater than 1V, whilst the other is substantially to earth potential ("0" state).

The emitter E3 is connected to the P-conductivity type base of a transistor T3 whose emitter is earthed and whose collector constitutes one of the outputs of the device.

The operation of the system is as follows:

The two emitters E1 and E2 are the inputs of the device whilst the collector C is its output.

If one of the inputs E1 or E2 is grounded ("0" level), the current $I=I_{BB}+(1-\alpha_p I_{CC}, \alpha_p$ being the common base gain of the transistor T1, flows across the unblocked base-emitter junction of the transistor T2 to earth; no current flows throgh the base of the transistor T3. The emitter of this latter being earthed, it is blocked and the output C being disconnected from the ground carries the level "1".

The same would be the case if the two inputs have the level "0". If neither of the inputs carries the level "0", that is to say if both of them carried the level "1", the current $I_{BB}$ will flow to earth across the base-emitter junction of the transistor T3 which will be conductive, and the output C will carry the level "0".

The foregoing circuit has another feature:

If the two inputs carry the level "0", each will receive half the current finished by the transistor T2, that is to say that if we call I its output current, then the condition $I=I_{E1}+I_{E2}$ will apply. Accordingly, the following logic table applies:

| E1 | E2 | $I_{E1}$ | $I_{E2}$ | $I_B$ | C |
|---|---|---|---|---|---|
| 0 | 0 | ½ | ½ | 0 | 1 |
| 0 | 1 | 1 | 0 | 0 | 1 |
| 1 | 0 | 0 | 1 | 0 | 1 |
| 1 | 1 | 0 | 0 | 1 | 0 |

The curent distributions in the conductors E1 and E2 and the base of the transistor T3, namely iE1, iE2 and iB are given by the equation:

$$I_{E1}+I_{E2}+I_B=[I_{BB}+(1-\alpha_p)I_{CC}]\alpha_n$$

$\alpha_p$ and $\alpha_n$ being the respective common base gains of the transistors T1 and T2.

However $\alpha_n$ is very close to 1 and $\alpha_p$ is very close to 0 as hereinabove.

We can therefore put:

$$I_B + I_{E1} + I_{E2} = I_{BB} + I_{CC}$$

It will be seen therefore that the sum of these three currents is constant. This explains why it is possible to distribute the emitter current in such a fashion as to have current signal of level ½, thus three current levels on the emitters E1 and E2.

It will be possible to use as many collectors as required and thus have levels ranging from 1/n to 1 at intervals of 1/n, which would make it possible to analog-digital converters. As far as the output C and the inputs E1 and E2 are concerned, the circuit behaves as a complemented AND-gate or in other words as a NAND-gate.

Figure 5:
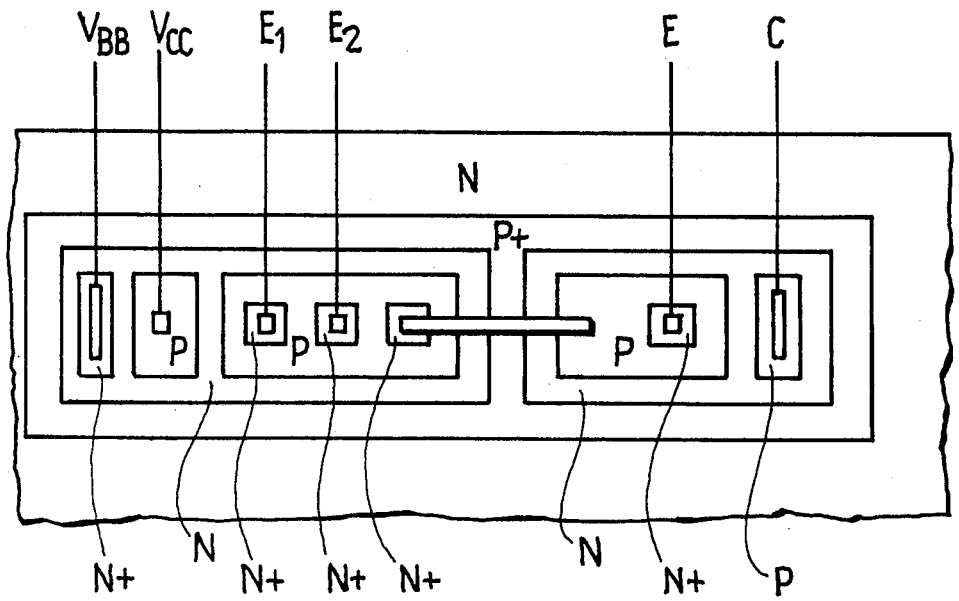
FIG. 5 is a plan view of a variant embodiment.

FIGS. 4 and 5 shows respectively a cross-sectional view and a view from above two embodiments of integrated circuits having the circuitry shown in FIG. 3 in the form of an equivalent diagram.

The substrate is of -P conductivity type material. Epitaxially grown on this substrate there is an n-zone, whilst an embedded n+-type layer is provided for each component as well as insulating walls of p+-type material. The other elements are obtained by diffusion or implantation in the layer N, through $SiO_2$ masks if the substrate is made of silicon.

Figure 6:
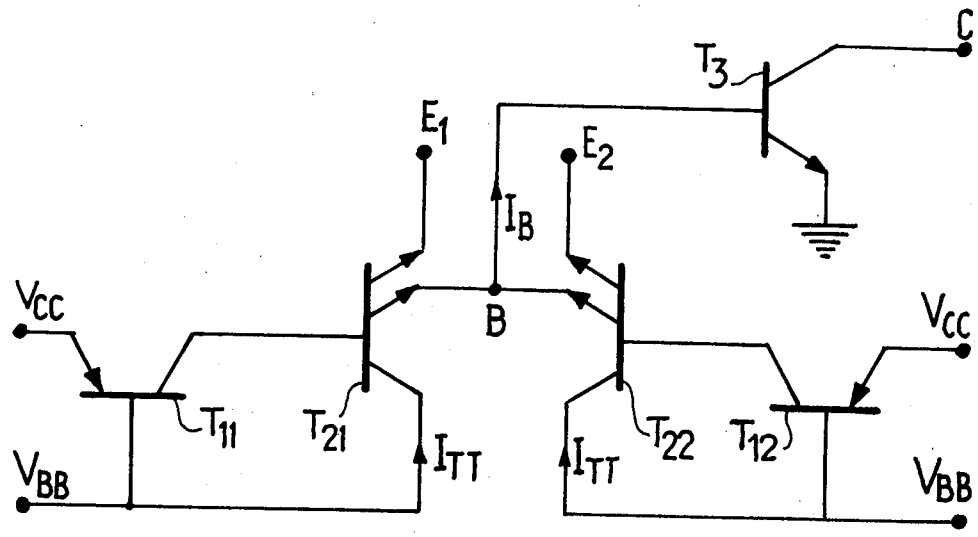
FIG. 6 is an example of a logic circuit using the element in accordance with the invention and FIG. 7 is a plan view of this device.

The circuit of FIG. 6 differs from that of FIG. 3 by the fact that it comprises two symmetrical elements, identical to those of FIG. 3 and constituted by the transistors T11 (PNP), T21 (NPN) with multiple emitters, in one case, and the transistors T12 and T22 in the other, these latter two being respectively identical to the transistors T11 and T21.

Two emitters belonging respectively to the transistors T21 and T22 are connected to the base B of the transistors T3 which is connected as shown in FIG. 3. The voltages $V_{BB}$ and $V_{CC}$ are respectively applied to the bases and to the emitters of the transistors T11 and T12.

The logic table for this circuit is of course as follows:

| E1 | E2 | $I_{E1}$ | $I_{E2}$ | $I_B$ | C |
|---|---|---|---|---|---|
| 0 | 0 | 1 | 1 | 0 | 1 |
| 1 | 0 | 0 | 1 | 1 | 0 |
| 0 | 1 | 1 | 0 | 1 | 0 |
| 1 | 1 | 0 | 0 | 2 | 0 |

In other words, substantially the following relationship applies:

$$i_B + i_{E1} = i_{E2} = 2i_{TT}$$

The logic relationship is that of a complemented OR-gate. The circuit of FIG. 5 can be expanded by using several inputs: $A_1$, $A_2$, $B_1$, $B_2$ for each transistor T21 or T22.

Figure 7:
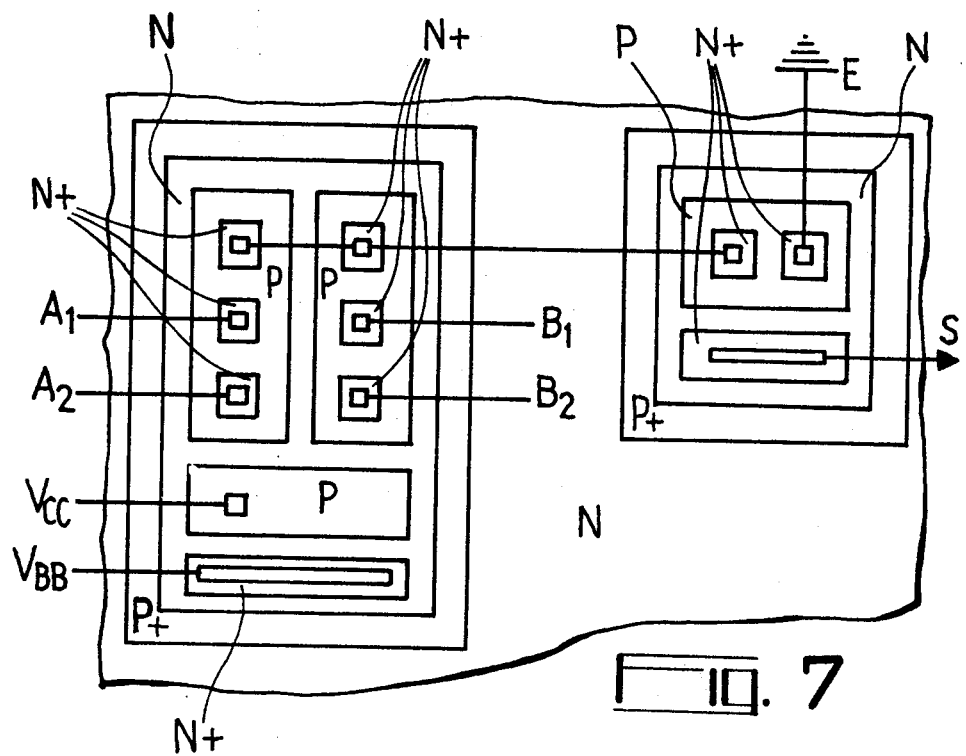

Then, an integrated circuit of the kind shown in plan in FIG. 7 is obtained.

What I claim is:

1. A logic element with low power consumption, comprising at least four semiconductor layers defining three rectifying junctions, forming a pair of complementary transistors integrated upon the same substrate, one first transistor being of lateral type and one second transistor of transverse type, emitter and the base of said first transistor being respectively connected to fixed bias sources, said second transistor having at least two emitters and said bias voltage sources being chosen so that the base-emitter junctions of said second transistor are unblocked when the corresponding emitter is earthed.

2. A logic element as claimed in claim 1, wherein said first transistor is of PNP conductivity type, the source biasing its base furnishing substantially lower voltage than that carried by the emitter.

3. A logic element as claimed in claim 2, comprising at least a third transistor of NPN conductivity type, having base connected to a first emitter of said second transistor, and its emitter to earth, the element comprising at least one input connected to a second emitter of said second transistor, the output being connected to the collector of the third transistor.

4. A logic element as claimed in claim 3, wherein said second transistor comprises at least three emitters and performs the function of a complemented AND-gate.

5. A logic element as claimed in claim 1, comprising two first lateral PNP transistors identical to each other, connected in parallel to the same bias sources, and associated respectively with two second, transverse NPN transistors, identical to each other and having two respective first interconnected emitters connected to the base of a third NPN transistor said third transistor having its emitter connected to the ground, the inputs being connected respectively to second emitters of the first NPN transistors and the output to the collector of said third transistor.

* * * * *